United States Patent
Chi-Kang et al.

(10) Patent No.: US 7,682,929 B2
(45) Date of Patent: Mar. 23, 2010

(54) METHOD AND STRUCTURE FOR DOUBLE LINING FOR SHALLOW TRENCH ISOLATION

(75) Inventors: Liu Chi-Kang, Shanghai (CN); Xin Wang, Shanghai (CN); Ze Ki Li, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 658 days.

(21) Appl. No.: 11/536,458

(22) Filed: Sep. 28, 2006

(65) Prior Publication Data

US 2007/0087519 A1    Apr. 19, 2007

(30) Foreign Application Priority Data

Sep. 29, 2005    (CN)    .................... 2005 1 0030312

(51) Int. Cl.
*H01L 21/76*    (2006.01)
(52) U.S. Cl. ................ 438/425; 257/E21.545; 257/E21.628; 438/221; 438/296; 438/359; 438/424
(58) Field of Classification Search .......... 257/E21.545, 257/E21.628; 438/221, 296, 359, 424, 425
See application file for complete search history.

(56) References Cited

U.S. PATENT DOCUMENTS

| | | | | |
|---|---|---|---|---|
| 6,242,323 | B1* | 6/2001 | Ishitsuka et al. | 438/435 |
| 6,541,382 | B1* | 4/2003 | Cheng et al. | 438/692 |
| 6,677,247 | B2* | 1/2004 | Yuan et al. | 438/723 |
| 6,720,234 | B2* | 4/2004 | Suzuki et al. | 438/424 |
| 2003/0176043 | A1* | 9/2003 | Kim et al. | 438/424 |

* cited by examiner

*Primary Examiner*—Asok K Sarkar
(74) *Attorney, Agent, or Firm*—Townsend and Townsend and Crew LLP (57) ABSTRACT

A method of forming an integrated circuit device structure having a design rule of less than 0.13 micron. The method includes providing a substrate and forming a pad oxide layer overlying the substrate. The method includes forming a nitride layer overlying the pad oxide layer and patterning the nitride layer and pad oxide layer. A trench structure is formed within a thickness of the substrate using the patterned nitride layer and pad oxide layer as hard mask. The method forms a first thickness of liner oxide within the trench structure using at least thermal oxidation of an exposed region of the trench structure to cover the trench structure. Such thermal oxidation causes a rounding region near corners of the trench structure. The method selectively removes the thickness of liner oxide within the trench structure. The method forms a second thickness of liner oxide within the trench structure using at least thermal oxidation to cover the trench structure. The thermal oxidation causes a further rounding of the rounded region near corners of the trench structure. The method also selectively removes the patterned nitride layer while the second thickness of liner oxide protects the substrate in the trench region.

14 Claims, 11 Drawing Sheets

Nitride pull back first

METHOD AND STRUCTURE FOR DOUBLE LINING FOR SHALLOW TRENCH ISOLATION

CROSS-REFERENCES TO RELATED APPLICATIONS

This application claims priority to Chinese Application No. 200510030312.8; filed on Sep. 29, 2005; commonly assigned, and of which is hereby incorporated by reference for all purposes.

BACKGROUND OF THE INVENTION

The present invention is directed to integrated circuits and their processing for the manufacture of semiconductor devices. More particularly, the invention provides a method and device for manufacturing a highly integrated circuit device having an improved trench isolation structure. Merely by way of example, the invention has been applied to advanced integrated circuit devices having a feature size of less than 0.13 micron. But it would be recognized that the invention has a much broader range of applicability. For example, the invention can be applied to other feature sizes, which are even smaller, e.g., 0.11 micron, 0.09 micron.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to form smaller and improved isolation structures. Isolation structures have been difficult for form and have evolved through the years.

As merely an example, conventional isolation structures include local oxidation of silicon, commonly called LOCOS. LOCOS has been effective through the years but is being replaced by trench isolation structures. Such trench isolation structures have been used for device having critical sizes of less than a predetermined dimension. Trench isolation has replaced, in part, LOCOS for advanced semiconductor devices. Although trench isolation has been effective, numerous limitations still exist. Such limitations have been described throughout the present specification and more particularly below.

From the above, it is seen that an improved technique for processing semiconductor devices including photo masks is desired.

BRIEF SUMMARY OF THE INVENTION

According to the present invention, techniques including methods for the manufacture of semiconductor devices are provided. More particularly, the invention provides a method and device for manufacturing a highly integrated circuit device having an improved trench isolation structure. Merely by way of example, the invention has been applied to advanced integrated circuit devices having a feature size of less than 0.13 micron. But it would be recognized that the invention has a much broader range of applicability. For example, the invention can be applied to other feature sizes, which are even smaller, e.g., 0.11 micron, 0.09 micron.

In a specific embodiment, the invention provides a method for fabricating an integrated circuit device structure having a design rule of less than 0.13 micron. The method includes providing a substrate and forming a pad oxide layer overlying the substrate. The method includes forming a nitride layer overlying the pad oxide layer and patterning the nitride layer and pad oxide layer. A trench structure is formed within a thickness of the substrate using the patterned nitride layer and pad oxide layer as hard mask. The hard mask is free from an overlying photoresist material in some embodiments. The method selectively etches a portion of an exposed region of the pad oxide layer to form an undercut region in the pad oxide layer overlying the substrate. The method forms a first thickness of liner oxide within the trench structure using at least thermal oxidation of an exposed region of the trench structure to cover the trench structure, whereupon the thermal oxidation causes a rounding region near corners of the trench structure. The method selectively removes the thickness of liner oxide within the trench structure. The method forms a second thickness of liner oxide within the trench structure using at least thermal oxidation to cover the trench structure. The thermal oxidation causes a further rounding of the rounded region near corners of the trench structure. The method also selectively removes the patterned nitride layer while the second thickness of liner oxide protects the substrate in the trench region.

In an alternative specific embodiment, the invention provides an integrated circuit device structure. The structure includes a silicon substrate, which has an active device region bonded by an isolation region. A trench region is defined in the isolation region of the substrate. A pad oxide layer is overlying the active device region on the silicon substrate. The structure has a nitride layer overlying the pad oxide layer and a liner oxide layer overlying the trench region to protect the trench region from attack from etching using at least phosphoric acid.

In yet an alternative specific embodiment, the invention provides a method for fabricating an integrated circuit device structure having a design rule of less than 0.13 micron. The method includes providing a semiconductor substrate and forming a pad oxide layer overlying the semiconductor substrate. Additionally, the method includes forming a nitride layer overlying the pad oxide layer and patterning the nitride layer and pad oxide layer to define a trench region. A trench structure having a width of less than 0.3 micrometer is formed through the patterned trench region within a thickness of the substrate using the patterned nitride layer and pad oxide layer as hard mask. Preferably, the hard mask is free from an overlying photoresist material. The method includes selectively etching a portion of an exposed region of the pad oxide layer to form an undercut region associated with the patterned nitride layer in the pad oxide layer overlying the substrate. The method forms a first thickness of thermal oxide in an exposed region of the trench structure to cover the trench structure. The thermal oxide reacts with the exposed region and causes a rounding region near corners of the trench structure via thermal oxidation. The method selectively removes the thickness of liner oxide within the trench structure to expose the trench structure. A second thickness of thermal oxide in the exposed trench structure is formed to cover the trench structure. The thermal oxide causes a further rounding of the rounded region near corners of the trench structure to a curvature of greater than 50 nanometers. The method then selectively removes the patterned nitride layer using an etching process while the second thickness of liner oxide protects the substrate in the trench region from the etching process. Alternatively, the method can also a single liner or more than two liners in alternative embodiments, depending upon the application.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the technique substantially eliminates or reduces damage to the trench region caused by nitride pullback, among other processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques including methods for the manufacture of semiconductor devices are provided. More particularly, the invention provides a method and device for manufacturing a highly integrated circuit device having an improved trench isolation structure. Merely by way of example, the invention has been applied to advanced integrated circuit devices having a feature size of less than 0.13 micron. But it would be recognized that the invention has a much broader range of applicability. For example, the invention can be applied to other feature sizes, which are even smaller in feature size, e.g., 0.11 micron, 0.09 micron.

A conventional method of forming a trench structure is provided as follows:
1. Provide silicon substrate;
2. Form pad oxide on the substrate;
3. Form silicon nitride on the pad oxide;
4. Form photoresist overlying the silicon nitride;
5. Pattern photoresist;
6. Etch silicon nitride and pad oxide through patterned photoresist;
7. Strip photoresist;
8. Etch trench region through patterned silicon nitride and pad oxide;
9. Perform nitride pull back;
10. Cause damage to the trench region during the pull back;
11. Perform pad undercut etch;
12. Grow liner oxide within trench; and
13. Fill trench structure with dielectric fill material.

These steps describe a conventional method of forming trench structures for isolation regions. The conventional method causes damage to the trench region, which causes an uneven isolation region, which causes reliability issues with active devices. Further details of the conventional method are described throughout the present specification and more particularly below.

FIGS. 1-6 are simplified side-view diagrams of a conventional method of forming trench isolation structures. As shown, the method begins by providing silicon substrate 101. An overlying pad oxide layer 103 is grown overlying the surface of the silicon substrate. The method forms a silicon nitride layer 105 overlying the pad oxide layer. The resulting structure is patterned.

Figure 1:
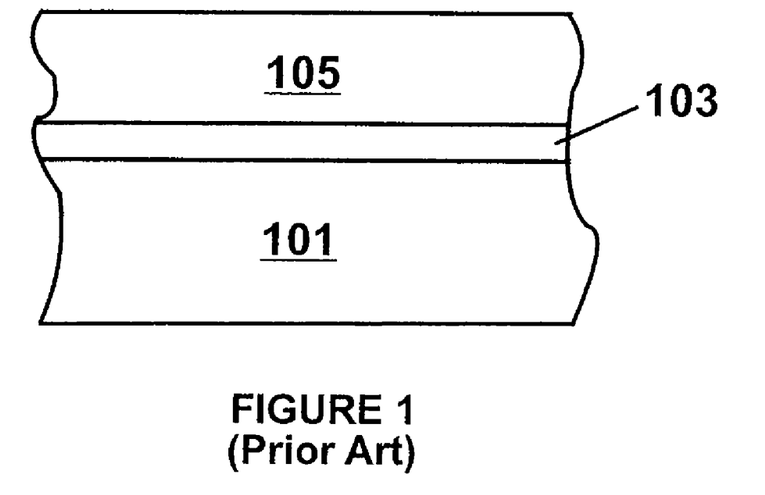
FIGS. 1-6 are simplified side-view diagrams of a conventional method of forming trench isolation structures.
Figure 2:
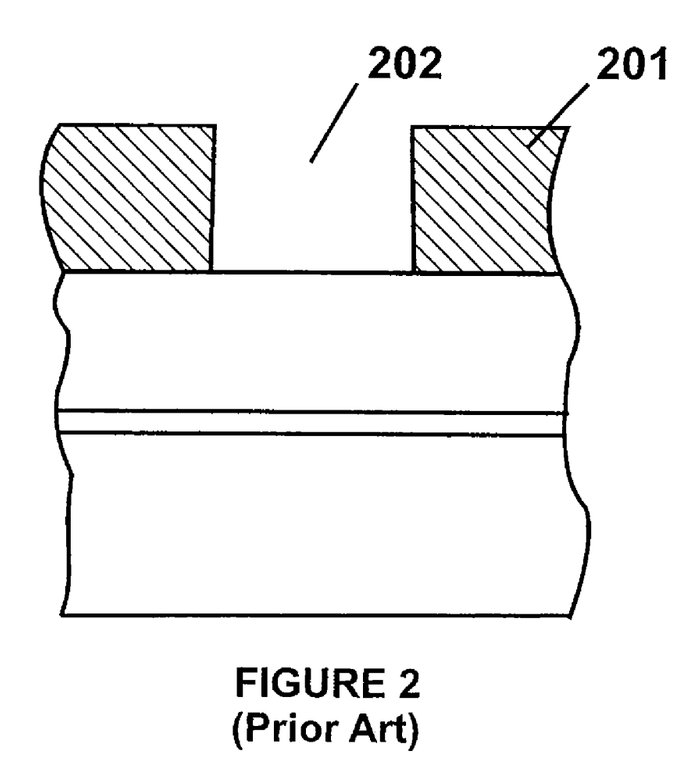
Figure 3:
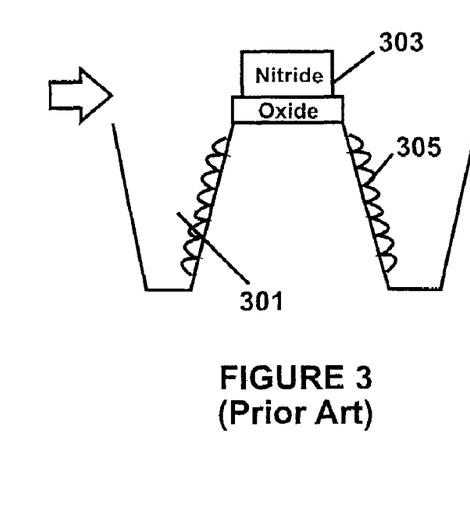

A photoresist film 201 is formed overlying the surface of the silicon nitride layer. The photoresist film is patterned to form an open region 202. The method performs an etching process to remove 303 a portion of the silicon nitride layer and oxide layer for patterning. The silicon oxide layer and nitride layer are now hard marks for further etching. The method uses reactive ion etching to form trench structures, which are often 4000 Å in depth and 0.2 microns in width according to a specific embodiment. The reactive ion etching uses a chlorine gas bearing species, but can also be others.

Figure 4:
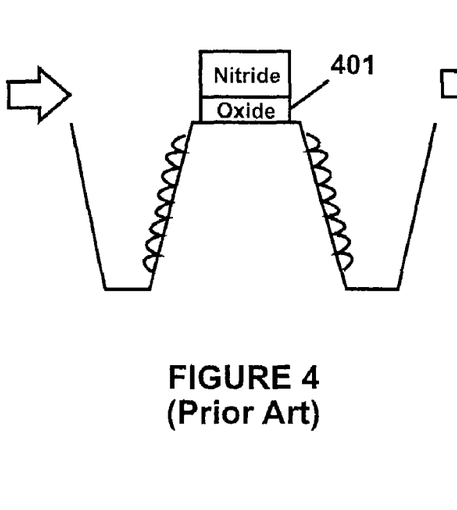
Figure 5:
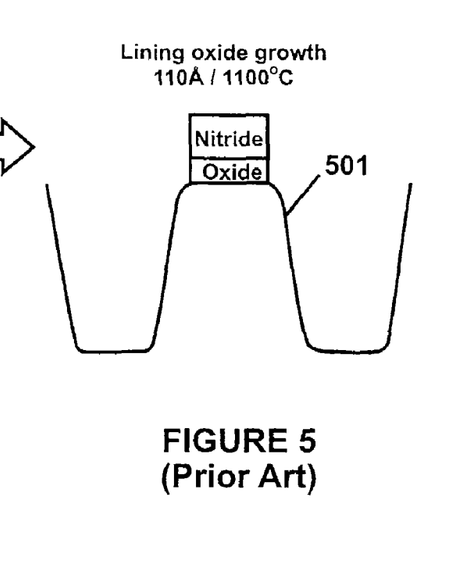
Figure 6:
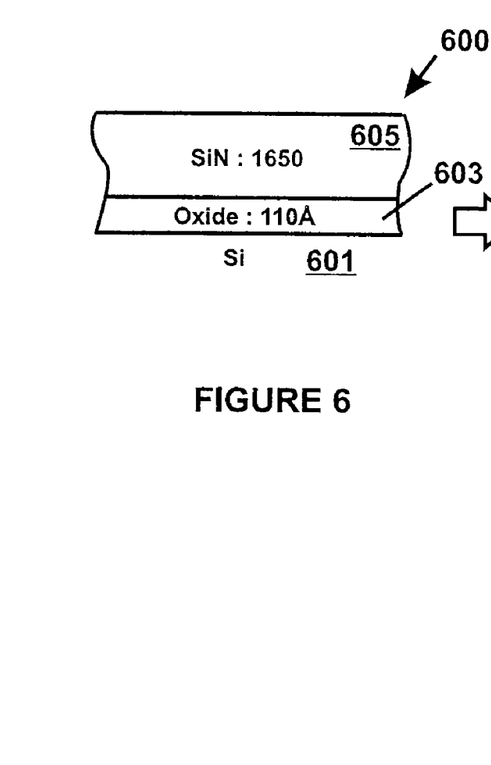

The conventional method removes a portion of the nitride layer using a "pull back" process. The nitride pull back process reduces a width of the nitride layer 303, which exposes a portion of the underlying pad oxide layer. The pull back process often uses a wet etchant, which is selective. The etchant is often phosphoric acid, but can also be others. As shown, the conventional pull back process causes surface roughness in regions 305, which are external walls of the trench. Here, silicon is exposed and subject to attack from the phosphoric acid. Referring to FIG. 4, the conventional method then performs an oxide undercut process 401, which shapes the pad oxide. The oxide undercut process is often performed using a buffered oxide etch (e.g.,BOE), but can also be hydrofluoric acid (e.g., HF). The method then oxidizes exposed surfaces of the trench, which forms region 501. Region 501 is a slight undercut. The undercut leads to limitations such as gate oxide quality, threshold voltage problems, and others, which we have discovered and will be in more detail below.

A method of forming a trench structure according to an embodiment of the present invention is provided as follows:
1. Provide silicon substrate;
2. Form pad oxide on the substrate;
3. Form silicon nitride on the pad oxide;
4. Form photoresist overlying the silicon nitride;
5. Pattern photoresist;
6. Etch silicon nitride and pad oxide through patterned photoresist;
7. Strip photoresist;
8. Etch trench region through patterned silicon nitride and pad oxide;
9. Perform pad undercut etch;
10. Grow liner oxide within trench to round corner near opening of trench;
11. Remove liner oxide;
12. Grow liner oxide within trench to cause further rounding of corner near opening of trench;

13. Pull back nitride layer, while using the liner oxide to protect the trench;

14. Fill trench structure with dielectric fill material;

15. Perform other steps, as desired.

These steps describe a method of forming trench structures for isolation regions according to an embodiment of the present invention. The present method is free from damage to the trench region during nitride pull back. Accordingly, reliability of resulting devices is improved over conventional devices. Further details of the conventional method are described throughout the present specification and more particularly below.

FIGS. 6-15 are simplified side-view diagrams of a method of forming trench isolation structures according to an embodiment of the present invention. These diagrams are merely examples, which should not unduly limit the scope of the claims herein. One of ordinary skill in the art would recognize many variations, alternatives, and modifications. As shown, the method begins by providing silicon substrate 601. An overlying pad oxide layer 603 is grown overlying the surface of the silicon substrate. The method forms a silicon nitride layer 605 overlying the pad oxide layer. The resulting structure is patterned.

Figure 7:
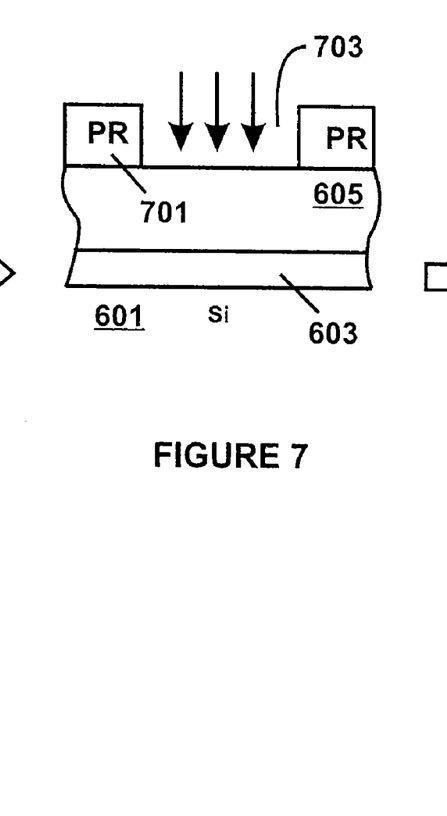
FIGS. 7-15 are simplified side-view diagrams of a method of forming trench isolation structures according to an embodiment of the present invention.
Figure 8:
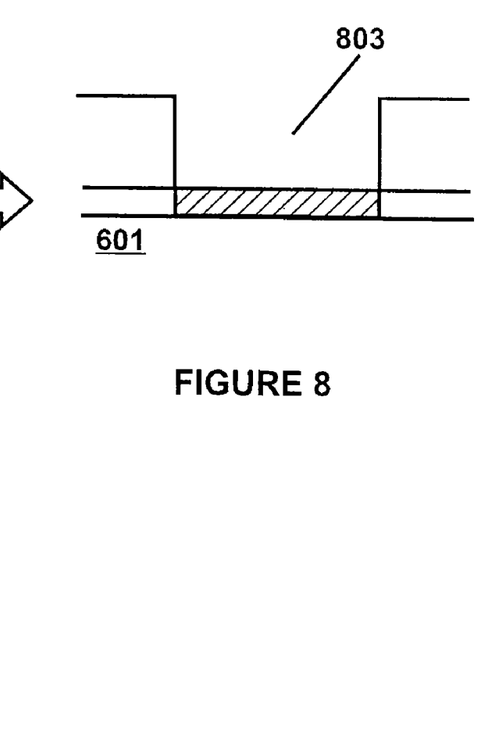
Figure 9:
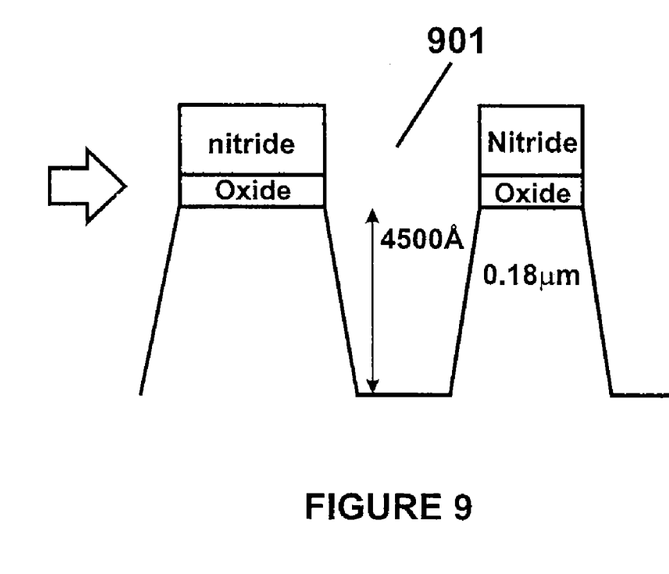

A photoresist film 701 is formed overlying the surface of the silicon nitride layer. The photoresist film is patterned to form an open region 703. The method performs an etching process to remove 803 a portion of the silicon nitride layer and oxide layer for patterning. The silicon oxide layer and nitride layer are now hard marks for further etching. Referring to FIG. 9, the present method uses reactive ion etching to form trench structures 901, which are often 4000Å in depth and 0.2 microns in width according to a specific embodiment. The reactive ion etching uses a chorine gas bearing species, but can also be others.

Figure 10:
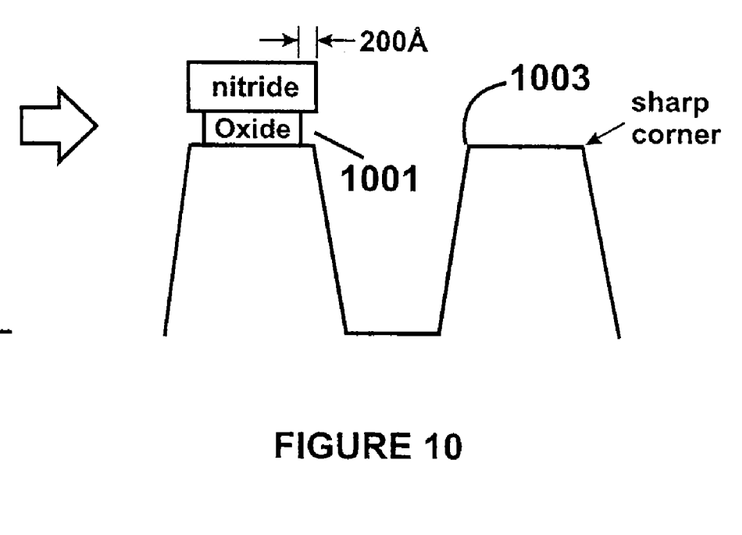
Figure 11:
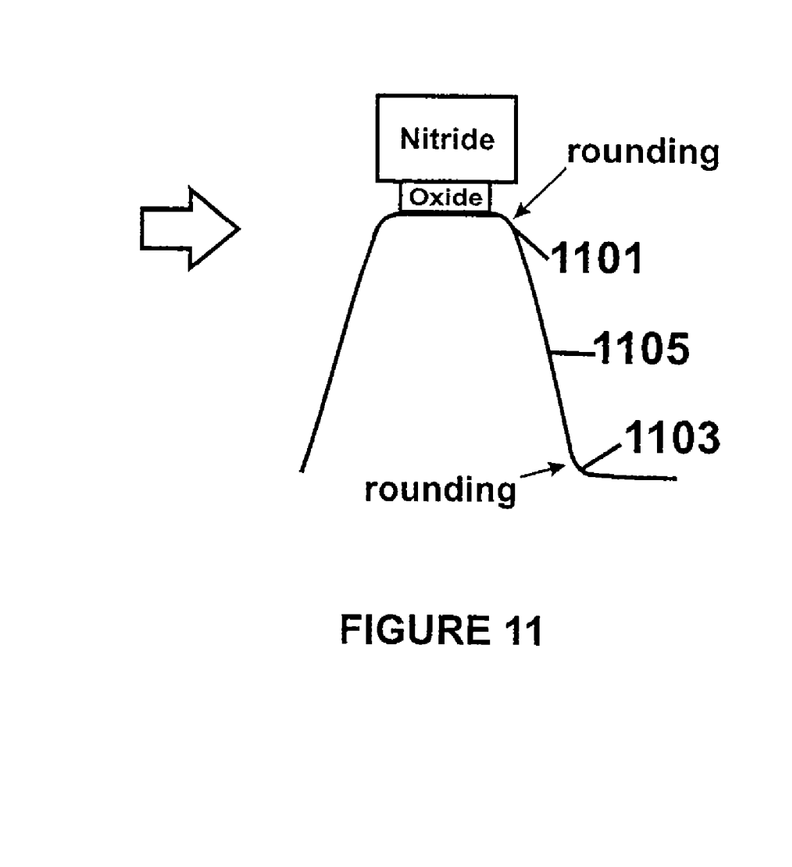
Figure 12:
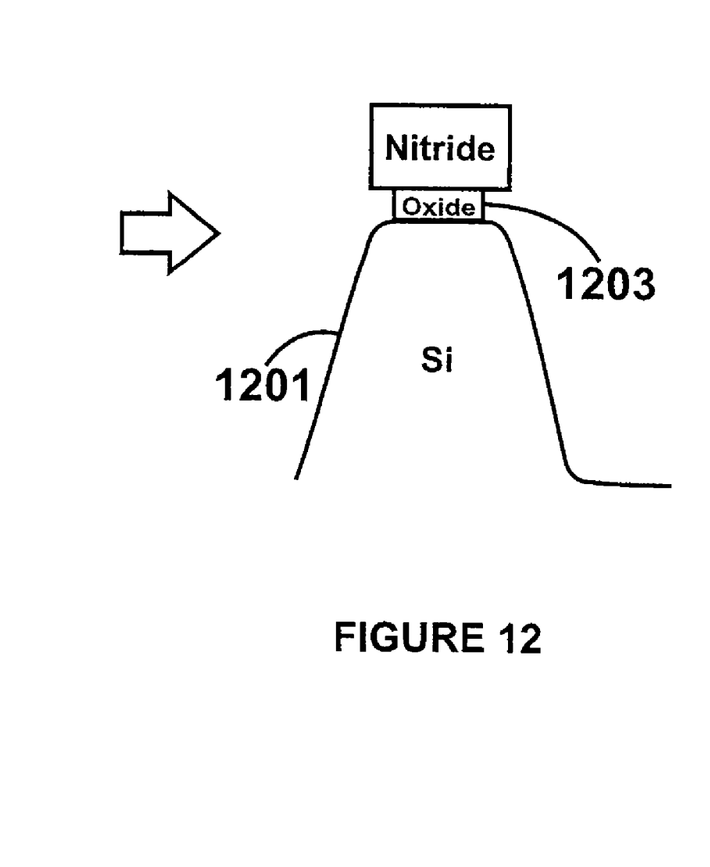

Next, the method includes a pad oxide undercut process as shown in the simplified cross-sectional view diagram of FIG. 10. The pad oxide under cut process yields an under cut pad oxide 1001. Additionally, sharp corners are often formed along the openings 1003 of the trench and bottom corners of the trench structure. The sharp corners often have a radius of curvature less than about 50 nanometers. The method performs a thermal oxide layer growth process, which rounds corners 1101 and 1103, as shown in the simplified diagram of FIG. 11. The thermal oxide forms a layer 1105, which has a thickness of at least 100 Angstroms, but can be less. Preferably, the thermal oxide layer has a thickness of about 110 Angstroms. The thermal oxide layer is formed using a suitable dry process such as oxidation in a furnace at a temperature of about 1100 Degrees Celsius. Referring to FIG. 12, the thermal oxide is selectively removed to expose bare silicon 1201 within the interior of the trench structures. Preferably, the selective removal occurs using a hydrofluoric acid dip or the like. Alternatively, selective plasma etching can also be used. The pad oxide is also slightly undercut, again. The thermal oxide causes rounding of the corners, where the corners have a radius of curvature ranging from about 50 nm to about 70 nm.

Figure 13:
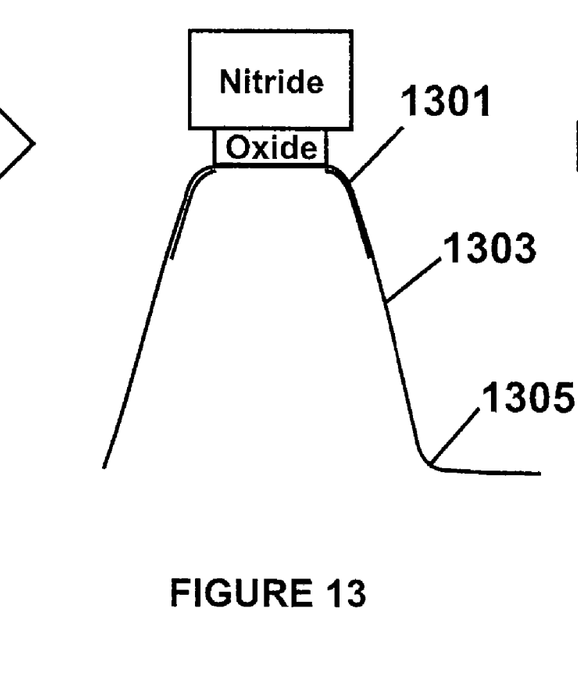

The method performs a second thermal oxide layer growth process, which rounds corners 1301 and 1305, as shown in the simplified diagram of FIG. 13. The thermal oxide forms a layer 1303, which has a thickness of at least 100 Angstroms, but can be less. Preferably, the thermal oxide layer has a thickness of about 110 Angstroms. The thermal oxide layer is formed using a suitable dry process such as oxidation in a furnace at a temperature of about 1100 Degrees Celsius. The thermal oxide causes further rounding of the corners again, where the corners have a radius of curvature ranging from about 30 nm to about 70 nm.

Figure 14:
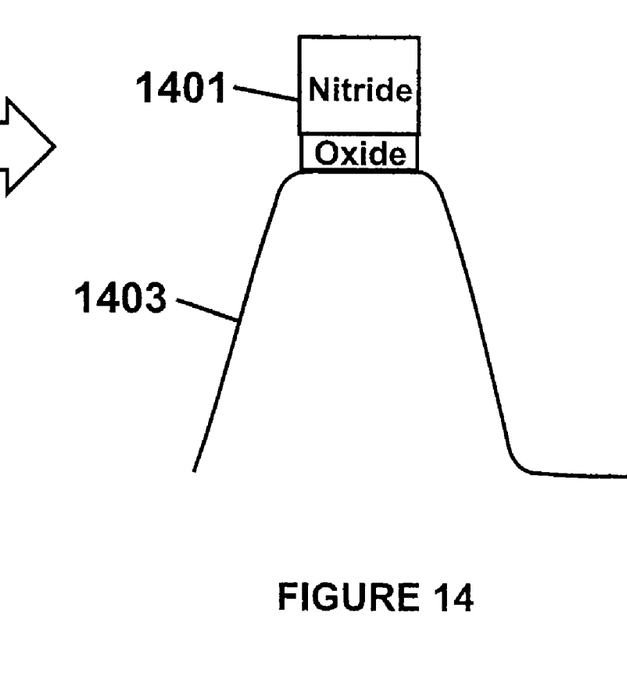
Figure 15:
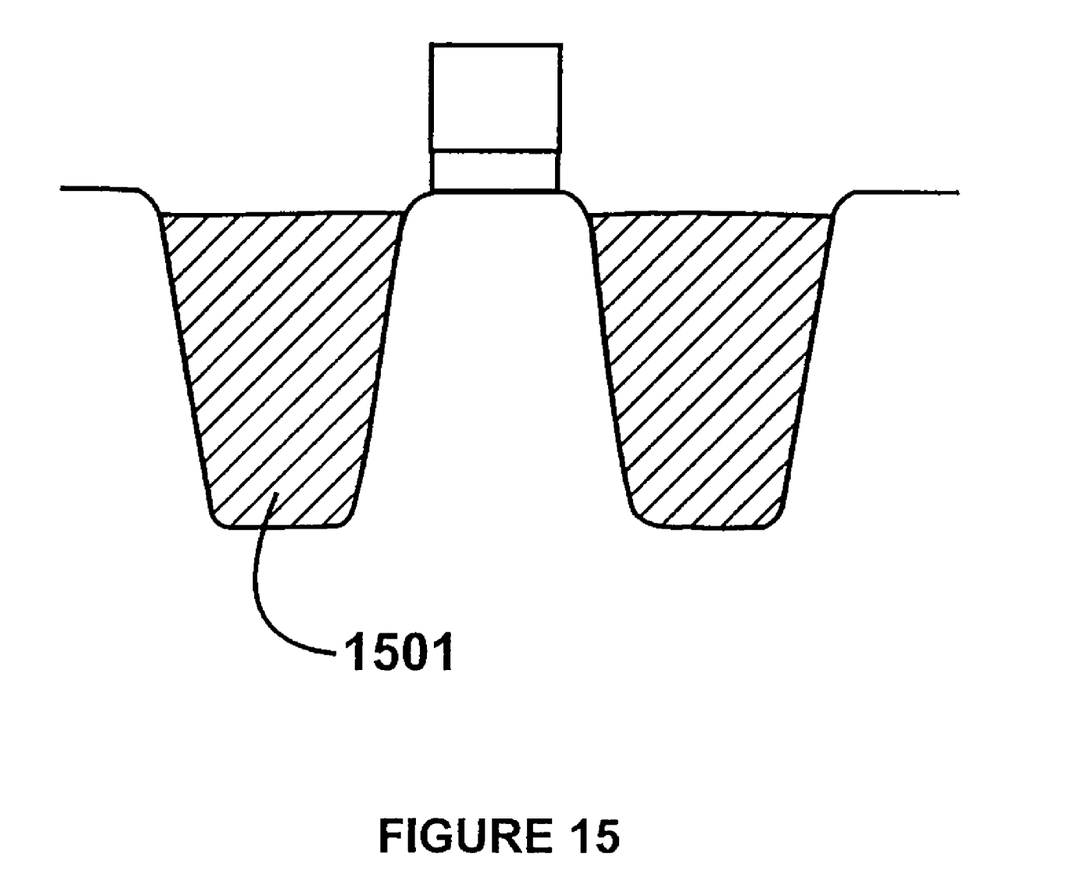

Referring to FIG. 13, the thermal oxide remains on the surfaces of the trench to keep bare silicon from being exposed. The present method removes a portion of the nitride layer using a "pull back" process, while the thermal oxide protects exposed portions of the silicon. The nitride pull back process reduces a width of the nitride layer 1401. The pull back process often uses a wet etchant, which is selective. The etchant is often phosphoric acid, but can also be others. As shown, the present pull back process provides smooth surface regions 1403, which are external walls of the trench. Here, silicon in the trench is not exposed and subject to attack from the phosphoric acid. The present method forms a substantially smooth surface in the trench regions that are free from surface roughness greater than about 20 Angstroms. The present method fills the trench regions with dielectric material, as shown in FIG. 15. Of course, one of ordinary skill in the art would recognize many variations, alternatives, and modifications.

The above sequence of steps provides a method according to an embodiment of the present invention. Other alternatives can also be provided where steps are added, one or more steps are removed, or one or more steps are provided in a different sequence without departing from the scope of the claims herein.

Experiments:

To prove the principle and operation of the present invention, we performed experiments. We used certain process steps noted above. P-type silicon wafers were used as starting material. An overlying pad oxide layer was grown to a thickness of 110 Angstroms using thermal oxidation. Oxygen was added to a furnace at a temperature of about 900 Degrees Celsius for 1 hour (time period). A silicon nitride layer was grown overlying the pad oxide layer. The silicon nitride layer was a CVD nitride, but can be others.

A photoresist film was formed overlying the surface of the silicon nitride layer. The photoresist film was patterned to form an open region. The nitride and pad oxide were patterned using an etching process. Such etching process used a chlorine gas species in a reactive ion etcher. Reactive ion etching was used to form trench structures, which are often 4500 Angstroms in depth and 0.2 microns in width according to a specific embodiment. The reactive ion etching uses a chlorine gas bearing species. Islands of silicon material surrounded by trench structures were formed. Such islands had a width of about 0.18 microns.

Figure 16:
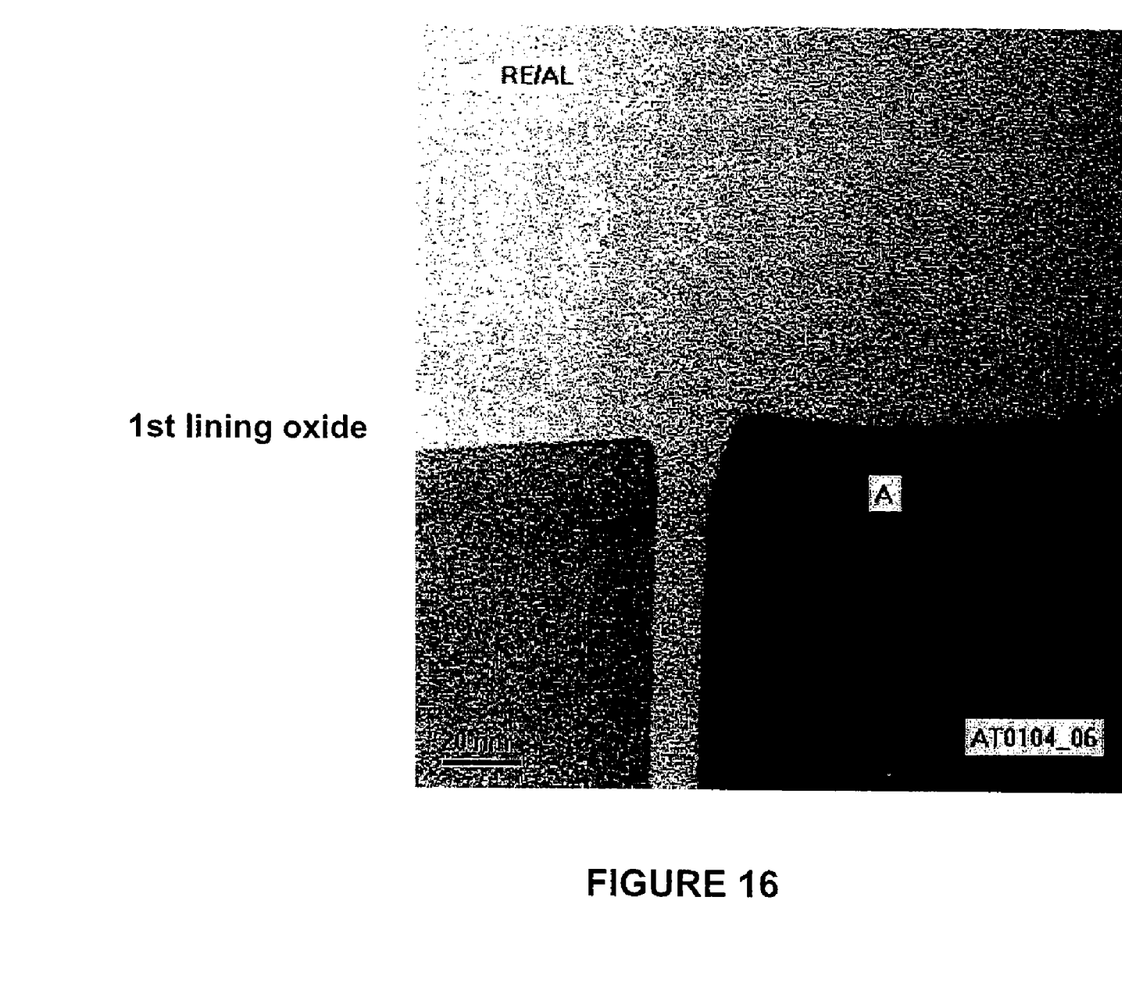
FIGS. 16-19 are simplified diagrams illustrating experiments performed according to an embodiment of the present invention
Figure 17:
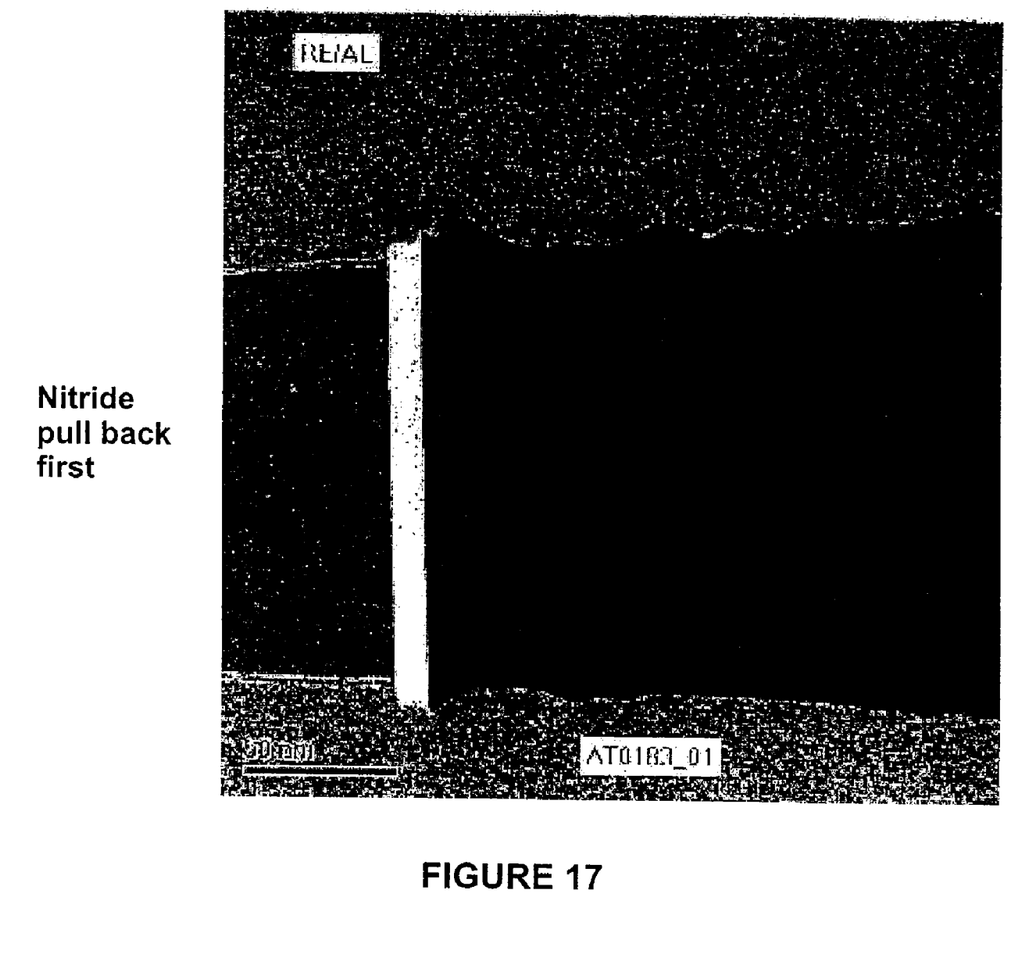

Next, we used HF dipping to under cut the pad oxide, which produced sharp corners along the openings of the trench and bottom corners of the trench structure. The sharp corners often have a radius of curvature less than about 10 nm. A 110 Angstroms thickness of thermal oxide was grown using a dry oxidation process at about 1100 Degrees Celsius. The thermal oxide causes rounding of the corners, where the corners have a radius of curvature ranging from about 30 nm to about 70 nm, as illustrated in FIG. 16. The thermal oxide was selectively removed using a hydrofluoric acid dip to expose bare silicon within the interior of the trench structures. The pad oxide is also slightly undercut, again. In contrast, we also performed the conventional method, which produced rough surfaces in the trench region, as illustrated by FIG. 17.

Figure 18:
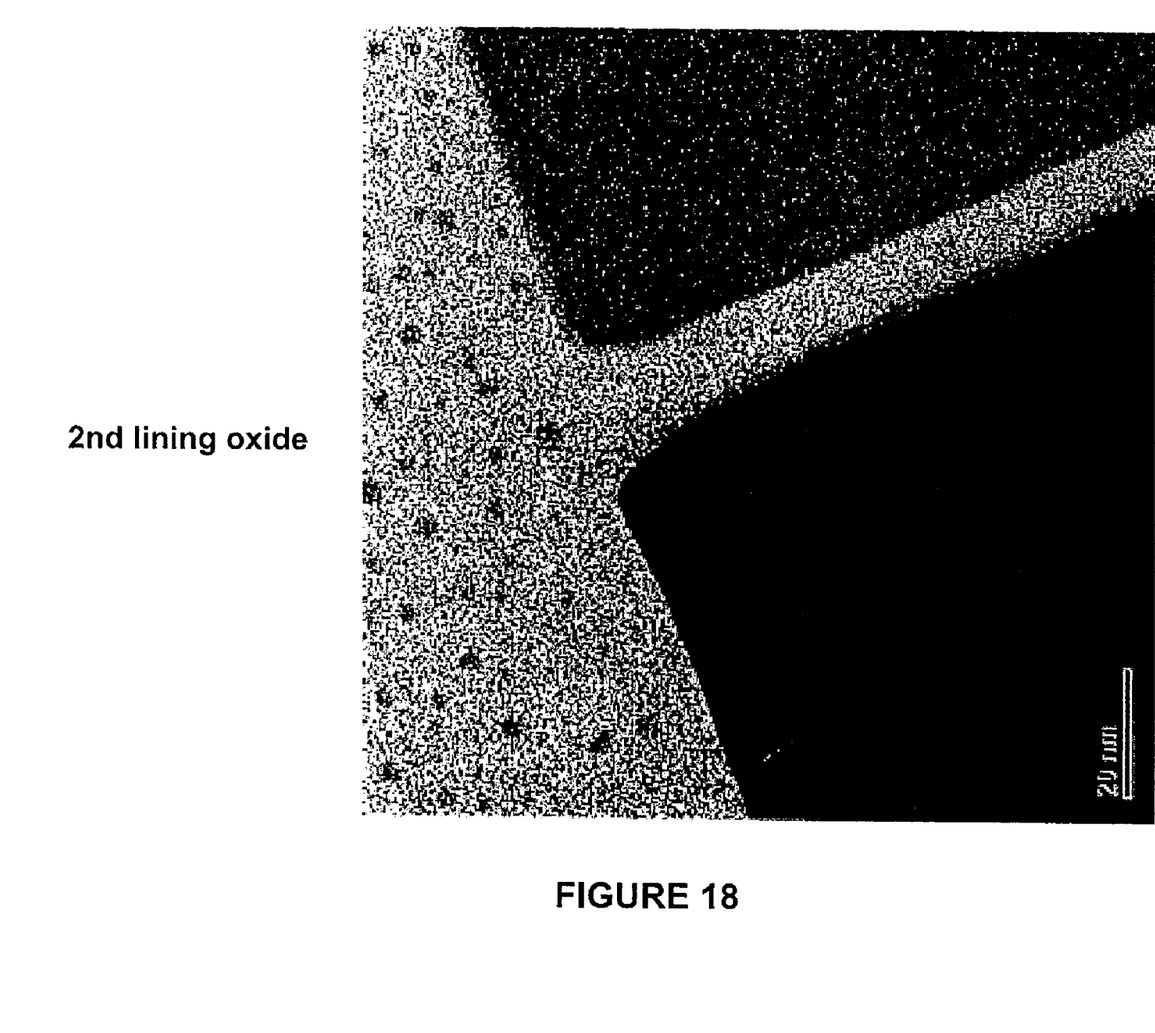

The experiment also used a second thermal oxide layer growth process, which rounds corners again, as shown in FIG. 18. The thermal oxide forms a layer of oxide that has a thickness of at least 110 Angstroms. The thermal oxide layer was formed using a dry process in a furnace at a temperature of about 1100 Degrees Celsius. The thermal oxide caused further rounding of the corners again, where the corners have a radius of curvature ranging from about 30 nm to about 70 nm.

We pulled the nitride layer back while the thermal oxide protected exposed portions of the silicon. The nitride pull back process reduced a width of the nitride layer. The pull back process used phosphoric acid and yielded smooth surface regions in the trench. Silicon in the trench was not exposed and subject to attack from the phosphoric acid. The present method formed a substantially smooth surface in the trench regions that are free from surface roughness greater than about 20 Angstroms.

Figure 19:
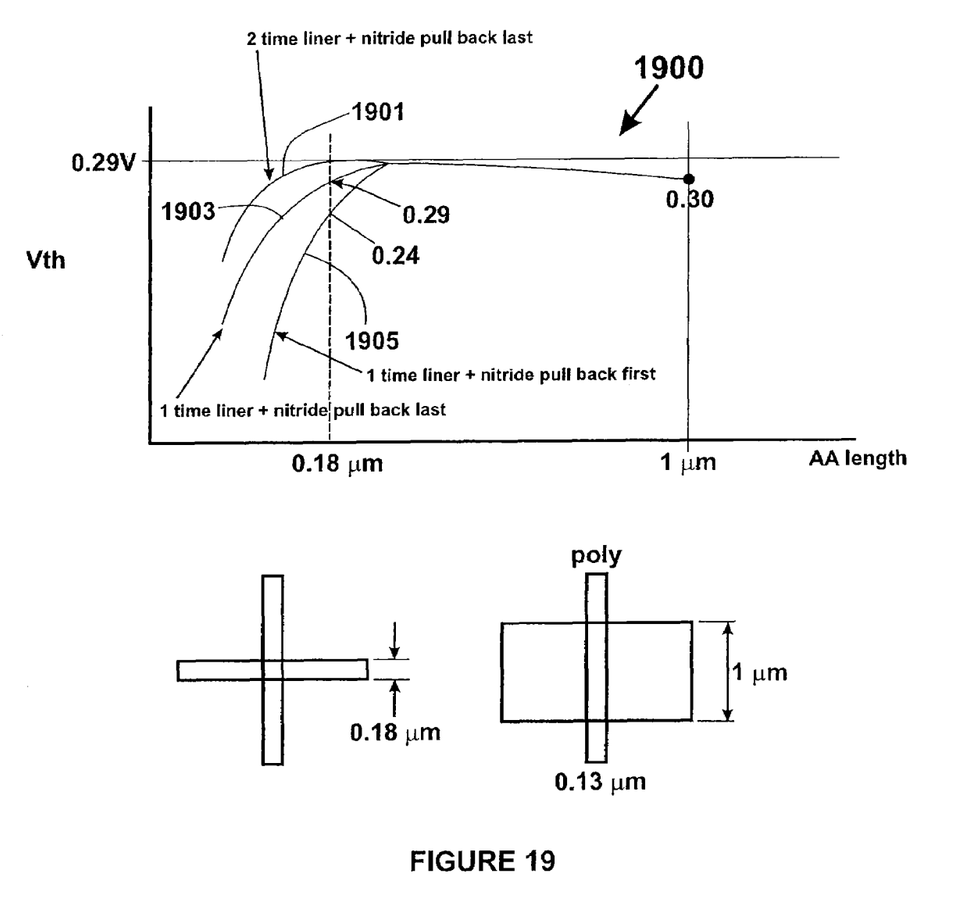

We also tested the threshold voltage drift of various devices to compare them against each other, as illustrated by FIG. 19. As shown, the vertical axis represents threshold voltage (Vth) of a MOS device, which has been plotted against line width. Each of the plots represents a different process. Plot 1905 represents the convention process, which causes threshold voltage drift after 0.18 microns. Plots 1903 and 1901 correspond to the present process. Plot 1903 corresponds to one liner oxide before nitride pull back and plot 1901 corresponds to a two-liner oxide process (which has been described above) before nitride pull back. As noted above, the two-liner oxide process provides more rounding on the corner regions of the trench, which is believed to reduce gate oxide stress among other limitations. Of course, one of ordinary skill in the art would recognize many variations, alternatives, and modification. Additionally, the present experiments are not intended to limit the scope of the claims herein.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating an integrated circuit device structure having a design rule of less than 0.13 micron, the method comprising:
   providing a substrate;
   forming a pad oxide layer overlying the substrate;
   forming a nitride layer overlying the pad oxide layer;
   patterning the nitride layer and pad oxide layer;
   forming a trench structure within a thickness of the substrate using the patterned nitride layer and pad oxide layer as hard mask, the hard mask being free from an overlying photoresist material;
   selectively etching a portion of an exposed region of the pad oxide layer to form an undercut region in the pad oxide layer overlying the substrate;
   forming a first thickness of liner oxide within the trench structure using at least thermal oxidation of an exposed region of the trench structure to cover the trench structure, whereupon the thermal oxidation causes a rounding region near corners of the trench structure;
   selectively removing the thickness of liner oxide within the trench structure;
   forming a second thickness of liner oxide within the trench structure using at least thermal oxidation to cover the trench structure, whereupon the thermal oxidation causes a further rounding of the rounded region near corners of the trench structure; and
   selectively removing a portion of the patterned nitride layer while the second thickness of liner oxide protects the substrate in the trench region.

2. The method claim 1 wherein the selectively etching process is a wet dip including fluorine bearing species.

3. The method of claim 1 wherein the selective removal of a portion of the patterned nitride is a nitride pull-back process using at least a phosphoric acid to reduce a width of the patterned nitride.

4. The method of claim 3 further comprising filling the trench region with a dielectric material, the dielectric material being a CVD oxide.

5. The method of claim 4 wherein the CVD oxide is a high density plasma process.

6. The method of claim 1 wherein the trench structure includes a width of less than 0.21 micron.

7. The method of claim 1 wherein the integrated circuit device is at least a 0.13 micron technology.

8. The method of claim 1 wherein the pad oxide has a thickness of less than 150 Angstroms.

9. The method of claim 1 wherein the protected trench structure is substantially free from surface non-uniformities having a dimension of greater than 100 Angstroms.

10. The method of claim 1 wherein the further rounded region has a radius of curvature ranging from about 30 nm to 70 nm.

11. A method for fabricating an integrated circuit device structure having a design rule of less than 0.13 micron, the method comprising:
    providing a semiconductor substrate;
    forming a pad oxide layer overlying the semiconductor substrate;
    forming a nitride layer overlying the pad oxide layer;
    patterning the nitride layer and pad oxide layer to define a trench region;
    forming a trench structure having a width of less than 0.2 micron through the patterned trench region within a thickness of the substrate using the patterned nitride layer and pad oxide layer as hard mask, the hard mask being free from an overlying photoresist material;
    selectively etching a portion of an exposed region of the pad oxide layer to form an undercut region associated with the patterned nitride layer in the pad oxide layer overlying the substrate;
    forming a first thickness of thermal oxide in an exposed region of the trench structure to cover the trench structure, whereupon the thermal oxide reacts with the exposed region and causes a rounding region near corners of the trench structure via thermal oxidation;
    selectively removing the thickness of liner oxide within the trench structure to expose the trench structure;
    forming a second thickness of thermal oxide in the exposed trench structure to cover the trench structure, whereupon the thermal oxide causes a further rounding of the rounded region near corners of the trench structure to a curvature of greater than 30 nm; and
    selectively removing a portion of the patterned nitride layer using an etching process while the second thickness of liner oxide protects the substrate in the trench region from the etching process.

12. The method of claim 11 wherein the semiconductor substrate is a silicon wafer.

13. The method of claim 11 wherein the etching processes uses hot phosphoric acid at a temperature greater than about 150 Degrees Celsius.

14. The method of claim 11 wherein the trench region is free from a roughness having a characteristic size of about 20 Angstroms and greater.

* * * * *